United States Patent
Glover et al.

(10) Patent No.: US 7,538,509 B1
(45) Date of Patent: May 26, 2009

(54) CONTROLLING THE SPEED OF COOLING FANS FOR MULTIPLE COMPUTER SYSTEMS BASED ON ALTITUDE/FLUID DENSITY MEASUREMENTS FROM A CENTRALIZED SENSOR

(75) Inventors: Troy W. Glover, Raleigh, NC (US); Michael S. June, Raleigh, NC (US); Whitcomb R. Scott, III, Chapel Hill, NC (US); Robert S. Smith, Dupont, WA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/192,983

(22) Filed: Aug. 15, 2008

(51) Int. Cl.
*H02P 5/68* (2006.01)
(52) U.S. Cl. .................. 318/481; 318/268; 388/929
(58) Field of Classification Search ............ 318/268, 318/272, 471, 481, 482, 105–113; 388/907.5, 388/929, 934
See application file for complete search history.

(56) References Cited

U.S. PATENT DOCUMENTS

| | | | | |
|---|---|---|---|---|
| 4,332,173 | A * | 6/1982 | MacManus | 73/861.89 |
| 5,492,082 | A * | 2/1996 | Krevinghaus et al. | 119/448 |
| 6,574,104 | B2 * | 6/2003 | Patel et al. | 361/695 |
| 6,694,759 | B1 * | 2/2004 | Bash et al. | 62/180 |
| 2002/0059804 | A1 * | 5/2002 | Spinazzola et al. | 62/259.2 |
| 2003/0173830 | A1 | 9/2003 | Smith et al. | |
| 2005/0019164 | A1 * | 1/2005 | Delano et al. | 416/61 |
| 2005/0280986 | A1 * | 12/2005 | Coglitore et al. | 361/687 |
| 2008/0055848 | A1 * | 3/2008 | Hamburgen et al. | 361/691 |

FOREIGN PATENT DOCUMENTS

| | | |
|---|---|---|
| DE | 4107481 | 9/1992 |
| EP | 1708068 | 10/2006 |

OTHER PUBLICATIONS

June, M., et al., "Air-Pressure-Dependent Control of Cooling Systems Using a Shared Air Pressure Sensor", U.S. Appl. No. 11/759,681, filed Jun. 7, 2007.
"Using a Mass Airflow Sensor to correct for altitude or airflow variations in computer system cooling designs" IBM, Technical Disclosure, IP.com Prior Art Database, IPCOM000033493D, Dec. 13, 2004.
"Device for Sensing Altitude Using Temperature Changes," IBM, Technical Disclosure, IP.com Prior Art Database, IPCOM000154538D, Jul. 5, 2007.

* cited by examiner

*Primary Examiner*—Bentsu Ro
(74) *Attorney, Agent, or Firm*—Patents on Demand, P.A.; Brian K. Buchheit

(57) ABSTRACT

The present invention can include an automated method controlling the fan speed of computer system cooling fans with altitude and/or fluid density data from a centralized sensor. Such a method can utilize a centralized sensor to determine the altitude/fluid density within an enclosed area. The centralized sensor can be positioned so as to be unaffected by extraneous activities within the enclosed area. The determined altitude/fluid density can be conveyed to a computer system containing one or more cooling fans. The computer system can be located within the enclosed area. Then, the computer system can determine the need for adjusting the speed of the cooling fans based on the altitude/fluid density. When the need for adjustment exists, the speed of the cooling fans can be adjusted in accordance with the altitude/fluid density.

7 Claims, 2 Drawing Sheets

CONTROLLING THE SPEED OF COOLING FANS FOR MULTIPLE COMPUTER SYSTEMS BASED ON ALTITUDE/FLUID DENSITY MEASUREMENTS FROM A CENTRALIZED SENSOR

BACKGROUND OF THE INVENTION

The present invention relates to the field of hardware control, and, more particularly, to controlling the speed of cooling fans for multiple computer systems based on altitude/fluid density measurements from a centralized altitude sensor.

Computer systems, particularly those systems consisting of multiple servers, require a cool operating environment for optimal operation. However, an air-conditioned room only provides static cooling for the computer systems. That is, the cool air sits around the housing of the computer system. Thus, most computer systems, such as rack-mounted systems, utilize multiple cooling fans in various locations to propel the cool air and/or draw the heated air through the computer system.

The computer systems often utilize various environmental factors to regulate the speed at which the cooling fans operate, typically the temperature of the air surrounding critical components of the computer system. Unfortunately, most computer systems ignore the altitude of the computer system when determining the speed of the cooling fans. Altitude is typically compensated for by configuring the cooling fans to run at a faster speed, which is unnecessary for low altitudes. Thus, cooling fans operate at a speed that is unnecessarily fast in low altitude environments, creating unnecessary noise and consuming more power. It should be noted that altitude is utilized loosely herein to refer generically to a density measurement of a working fluid. The working fluid being measured is typically air, which is able to be measured with an altitude sensor or some other fluid density sensor.

To accurately adjust and/or monitor the altitude at which the computer system is operating, conventional solutions require the installation and configuration of an altimeter component to each computer system. However, this approach is not cost-effective in the majority of situations.

BRIEF DESCRIPTION OF THE SEVERAL VIEWS OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
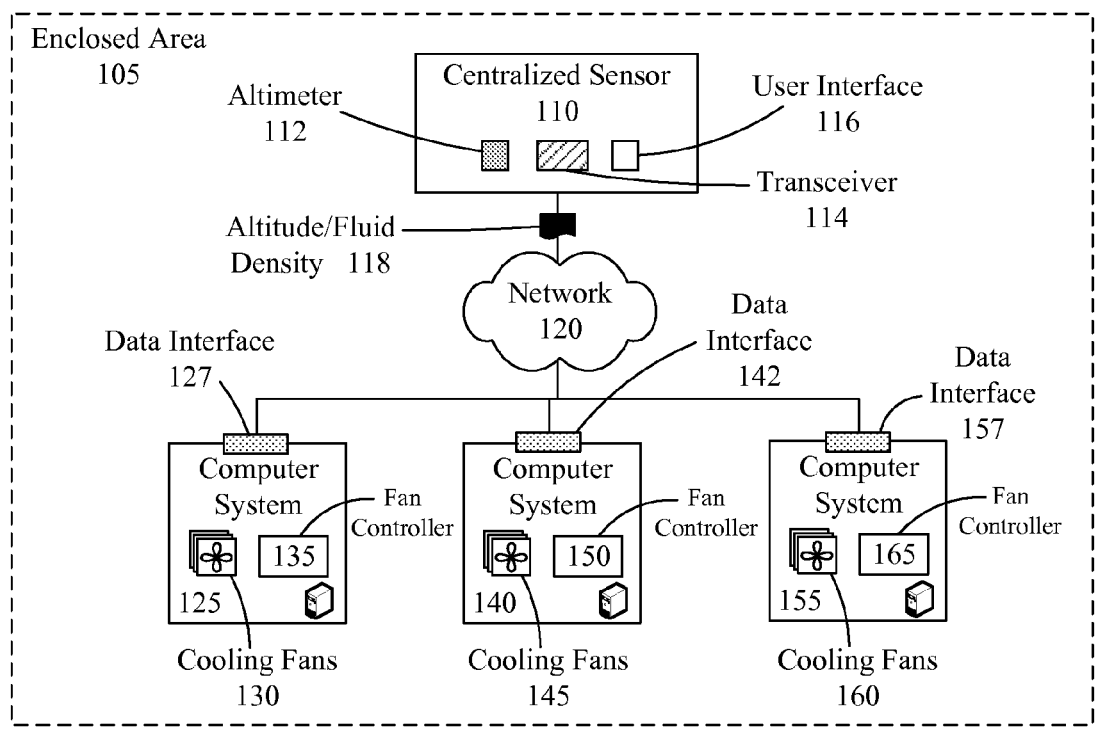
FIG. 1 is a schematic diagram illustrating a system for using a centralized sensor to measure the altitude/fluid density of an enclosed area and provide the altitude to multiple computer systems in accordance with embodiments of the inventive arrangements disclosed herein.

The present invention discloses a solution that can use altitude/fluid density data from a central source to control the speed of cooling fans in multiple computer systems. This solution can utilize a centralized sensor to measure the altitude and/or fluid density of the enclosed area housing the computer systems. The measured altitude/fluid density can then be conveyed to all the computer systems. The fan controlling component of the computer systems can then determine the need for adjusting the speed of their cooling fans based on the altitude/fluid density.

Although often discussed in terms of altitude, technically adjustments in cooling fans result from changes in density of a working fluid (typically air). In common situations (where density of a working fluid correlates to environmental altitude), an altitude sensor can be used for measurements and adjustments can be made based upon sensor produced results. Other situations exist; however, where density of a working fluid varies independent of altitude, a density sensor (as opposed to an altitude sensor) can be used to generate a density measurement, which drives controls changes. It should be appreciated that all references to altitude, altitude sensors, and altitude measures are to be interpreted as applying to working fluid, density sensors, and fluid density measurements.

The present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including, but not limited to the Internet, wireline, optical fiber cable, RF, etc.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. Examples of a computer-readable medium include a semiconductor or solid state memory, magnetic tape, a removable computer diskette, a random access memory (RAM), a read-only memory (ROM), an erasable programmable read-only memory (EPROM or Flash memory, a rigid magnetic disk and an optical disk. Current examples of optical disks include compact disk-read only memory (CD-ROM), compact disk-read/write (CD-R/W) and DVD. Other computer-readable medium can include a transmission media, such as those supporting the Internet, an intranet, a personal area network (PAN), or a magnetic storage device. Transmission media can include an electrical connection having one or more wires, an optical fiber, an optical storage device, and a defined segment of the electromagnet spectrum through which digitally encoded content is wirelessly conveyed using a carrier wave.

Note that the computer-usable or computer-readable medium can even include paper or another suitable medium upon which the program is printed, as the program can be electronically captured, for instance, via optical scanning of the paper or other medium, then compiled, interpreted, or otherwise processed in a suitable manner, if necessary, and then stored in a computer memory.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

FIG. 1 is a schematic diagram illustrating a system 100 for using a centralized sensor 110 to measure the altitude/fluid density 118 of an enclosed area 105 and provide the altitude/fluid density 118 to multiple computer systems 125, 140, and 155 in accordance with embodiments of the inventive arrangements disclosed herein. In system 100, computer systems 125, 140, and 155 can be adjust the speed of their cooling fans 130, 145, and 160 based on the altitude/fluid density measurement 118 provided by the centralized sensor 110.

Both the centralized sensor 110 and computer systems 125, 140, and 155 can reside within the enclosed area 105, meaning that the altitude/fluid density 118 measured by the centralized sensor 110 represents the altitude/fluid density 118 experienced by the computer systems 125, 140, and 155. The enclosed area 105 can correspond to a server room or data center or any other enclosed space where a reasonably consistent fluid density reading (e.g., air pressure) can be achieved.

The centralized sensor 110 can represent an instrumentation system configured to measure the altitude/fluid density 118 of the enclosed area 105, and convey the altitude 118 over a network 120 to the computer systems 125, 140, and 155. It should be noted that the centralized sensor 110 should be positioned within the enclosed area 105 such as to minimize disruption to its operation by regular activity within the enclosed area 105. For example, the centralized sensor 110 can be positioned away from any doorways of the enclosed area 105 so that air currents generated by the entry/exit of personnel do not inadvertently cause unwarranted measurements.

The centralized sensor 110 can include an altimeter (or other fluid density sensor) 112, a transceiver 114, and a user interface 116. The altimeter 112 can represent an instrument configured to measure the altitude 118 of the enclosed area 105. Measurement of the altitude 118 can be conducted based on atmospheric properties of the enclosed area 105, such as the barometric pressure or air density. In other embodiments, other fluid density sensors can be used in place of altimeter 112. This is especially true when a density of a working fluid of the enclosed area 105 varies independent of altitude, which is a special case implementation of system 100.

Additionally, the altimeter 112 can include components for converting the raw altitude reading (or other fluid density readings) into a format that can be conveyed to and understood by the computer systems 125, 140, and 155. For example, the altimeter 112 can include a signal converter (not shown) for converting an analog signal representing the altitude 118 into a digital signal.

The user interface 116 can correspond to a mechanism by which the centralized sensor 110 can be configured and/or manually operated. Configuration of the centralized sensor 110 can include the definition of the time interval at which the centralized sensor 110 measures the altitude/fluid density 118. For example, the centralized sensor 110 can be configured to conduct a measurement of the altitude/fluid density 118 at a specified time every day, after the passage of a set time period, or when a change in altitude/fluid density 118 is detected.

In an alternate embodiment, the user interface 116 can configure the centralized sensor 110 to measure the altitude/fluid density 118 in response to requests by the computer systems 125, 140, and 155. In such an embodiment, the user interface 116 can provide a remote communication mechanism for the fan controllers 135, 150, and 165 of the computer systems 125, 140, and 155 to define the time between requests.

The measured altitude/fluid density 118 can then be conveyed to the computer systems 125, 140, and 155 using the transceiver 114. The transceiver 114 can assume a variety of forms dependent upon implementation, including, but not limited to, a WIFI transceiver, an ETHERNET cable, a BLUETOOTH transceiver, and the like. It should be emphasized that the transceiver 114, network 120, and data interfaces 127, 142, and 157 all need to be compatible for communication with each other.

The computer systems 125, 140, and 155 can represent a grouping of one or more computing devices or subsystems 137, 147, and 167, such as a server rack containing multiple computer servers. Each computer system 125, 140, and 155 can include a data interface 127, 142, and 157, one or more cooling fans 130, 145, and 160, and a fan controller 135, 150, and 165. Each fan 130, 145, and 160 can be contained within/directed towards the associated system 125, 140, and 155. In one embodiment, one or more area 105 fans can be present, which are able to be controlled using sensor 110 input. In one embodiment, the data interfaces 127, 142, 157 can be interfaces of one or more of the subsystem computers 137, 147, and 167, as can the fan controllers 135, 150, and 165.

In one embodiment, each of the subsystems 137, 147, and 167 can include one or more subsystem fan 138, 148, and 168. For example, each subsystem 137, 147, and 167 can be a computing component having a subsystem case, within which one or more fans 138, 148, and 168 reside. In one embodiment, the subsystem 137, 147, and 167 can include a subsystem specific fan controller that is functionally similar to controllers 135, 150, and/or 165. These subsystem fan controllers can control the fans 138, 148, and 168 based upon sensor 110 provided input. That is, each subsystem 137, 147, and 167 can receive fluid density data from the centralized server 110, which it uses to selectively adjust the speed of a fan 138, 148, and 168 should an adjustment need be determined.

The data interface 127, 142, and 157 can represent the mechanism by which the computer system 125, 140, and 155 can exchange data over the network 120. The data interface 127, 142, and 157 can include hardware and/or software components, such as a baseboard management controller (BMC) utilizing an Intelligent Platform Management Interface (IPMI), configured to facilitate the use of the altitude/fluid density 118 by the fan controller 135, 150, and 165 to adjust the speed of the cooling fans 130, 145, and 160.

As such, the altitude/fluid density 118 sent by the centralized altitude sensor 110 can include commands of a standardized hardware interface language that can be interpreted by the data interface 127, 142, and 157 and/or the fan controller 135, 150, and 165. Examples of the standardized hardware interface language can include, but are not limited to, the Simple Network Management Protocol (SNMP), the Desktop Management Interface (DMI), the Common Information Model (CIM), and the WINDOWS Management Instrumentation (WMI).

The fan controller 135, 150, and 165 can be a hardware and/or software component configured to determine the operational speed of the cooling fans 130, 145, and 160 based on the altitude 118. Consideration of the altitude 118 by the fan controller 135, 150, and 165 can be in addition to existing environmental variables such as temperature. The fan controller 135, 150, and 165 can also utilize algorithms that minimize the noise level of the cooling fans 130, 145, and 160.

When warranted by the altitude/fluid density 118, the fan controller 135, 150, and 165 can execute the necessary commands to adjust the operational speed of the cooling fans 130, 138, 145, 148, 160, and 168. The cooling fans 130, 138, 145, 148, 160, and 168 can represent the air flow mechanisms of the computer systems 125, 140, and 155 and/or subsystems 137, 147, and 167 for the purpose of moving air around and/or through components. The cooling fans 130, 138, 145, 148, 160, and 168 can have various operational speed settings that can be controlled by the fan controllers 135, 150, and 165.

The network 120 can include any hardware/software/firmware necessary to convey digital content encoded within carrier waves. Content can be contained within analog or digital signals and conveyed through data or voice channels and can be conveyed over a personal area network (PAN), a local area network (LAN), or a wide area network (WAN). The network 120 can include local components and data pathways necessary for communications to be exchanged among computing device components and between integrated device components and peripheral devices. The network 120 can also include network equipment, such as routers, data lines, hubs, and intermediary servers which together form a packet-based network, such as the Internet or an intranet. The network 120 can further include circuit-based communication components and mobile communication components, such as telephony switches, modems, cellular communication towers, and the like. The network 120 can include line based and/or wireless communication pathways.

Figure 2:
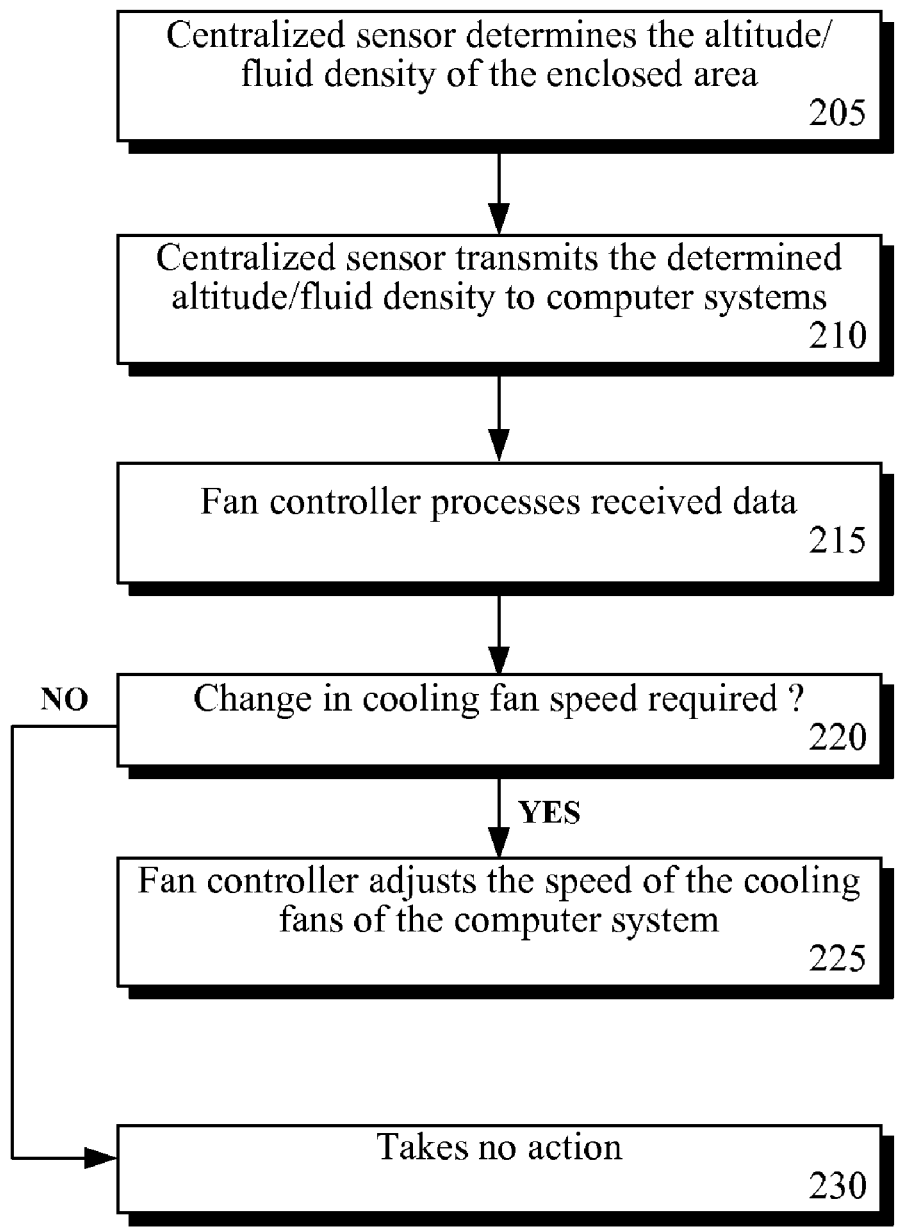
FIG. 2 is a flow chart of a method describing the use of altitude/fluid density measured by a centralized sensor to control the operational speed of the cooling fans of multiple computer systems in accordance with an embodiment of the inventive arrangements disclosed herein.

FIG. 2 is a flow chart of a method 200 describing the use of altitude/fluid density measured by a centralized sensor to control the operational speed of the cooling fans of multiple computer systems in accordance with an embodiment of the inventive arrangements disclosed herein. Method 200 can be performed in the context of system 100 or any other system configured to support the use of altitude/fluid density data from a centralized source to control the cooling fans of multiple computer systems.

Method 200 can begin in step 205 where the centralized sensor can determine the altitude/fluid density of the enclosed area. The execution of step 205 can be in response to a request for the altitude by one or more computer system, the passage of a predetermined time period, the detection of a change in the altitude/fluid density by the centralized sensor, and/or a user-executed command. In step 210, the centralized sensor can transmit the determined altitude to the computer systems.

The fan controller of each computer system can process the received altitude/fluid density in step 215. It should be noted that step 215 is executed independently by the fan controller of each computer system, allowing for differences in the operating environments of the distinct computer systems to be taken into account. That is, the altitude can trigger one computer system to adjust the speed of its cooling fans, while another computer system can determine that no change is necessary.

In step 220, the fan controller can determine if the altitude/fluid density requires a change in the speed of the cooling fans. When the fan controller determines that the altitude/fluid density warrants a change, step 225 can execute where the fan controller can adjust the speed of the cooling fans. When a change in fan speed is not warranted by the altitude/fluid density, then the fan controller can take no action in step 230.

The diagrams in FIGS. 1-2 illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An automated method for controlling the fan speed of computer system cooling fans with fluid density data from a centralized sensor comprising:

determining a fluid density by a centralized sensor within an enclosed area, said enclosed area comprising a plurality of computer systems, wherein said centralized sensor is external to each of the computer systems, wherein each computer system configured to house at least one computer subsystem;

conveying the determined fluid density to each of the computer systems which employs at least one cooling fan;

in response to the conveying step, each of the computer systems selectively determining a need for adjusting a speed of the at least one cooling fan based on the determined fluid density; and when the need for an adjustment exists, each of the computer systems adjusting the speed of the at least one cooling fan in accordance with the fluid density.

2. The method of claim 1, wherein the enclosed area is a server room, wherein each of the computer systems is a rack, wherein each computer subsystem is a rack-mountable computing device, and wherein a fluid being measured is air.

3. The method of claim 2, wherein said at least one subsystem comprises a plurality of subsystems per each of the computer systems.

4. The method of claim 1, wherein each computer subsystem comprises a subsystem specific enclosure and at least one subsystem cooling fan included inside the subsystem specific enclosure, wherein said at least one cooling fan is located within an enclosure of the associated one of the computer systems and outside subsystem specific enclosures, said method further comprising:

conveying the determined fluid density to at least one computer subsystem;

in response to the conveying step, the at least one computer subsystem determining a need for adjusting a speed of at least one subsystem cooling fan based on the determined fluid density; and when the need for an adjustment exists, adjusting the speed of at least one subsystem cooling fan in accordance with the fluid density.

5. The method of claim 4, wherein the enclosed area is a server room, wherein each of the computer systems is a rack, wherein each computer subsystem is a rack-mountable computing device, wherein a fluid being measured is air.

6. The method of claim 5, wherein said at least one subsystem comprises a plurality of subsystems per each computer system.

7. The method of claim 1, wherein each of the computing systems adjust the speed of the at least one cooling fan based upon the fluid density of the centralized sensor, wherein no other fluid density reading such as one taken by another fluid density sensor is utilized by the computing system to adjust the speed of the at least one cooling fan.

* * * * *